United States Patent [19]
Yamaguchi

[11] Patent Number: 5,877,526
[45] Date of Patent: Mar. 2, 1999

[54] SEMICONDUCTOR DEVICE HAVING POLYSILICON THIN-FILM

[75] Inventor: Michiya Yamaguchi, Akishima, Japan

[73] Assignee: Casio Computer Co., Ltd., Tokyo, Japan

[21] Appl. No.: 851,404

[22] Filed: May 5, 1997

Related U.S. Application Data

[63] Continuation of Ser. No. 247,240, May 23, 1994, abandoned, which is a continuation-in-part of Ser. No. 21,333, Feb. 23, 1993.

[30] Foreign Application Priority Data

Feb. 28, 1992 [JP] Japan ..................................... 4-75921

[51] Int. Cl.⁶ .................................................. H01L 29/792
[52] U.S. Cl. ............................................................ 257/325
[58] Field of Search ............................................. 257/325

[56] References Cited

U.S. PATENT DOCUMENTS

| | | |
|---|---|---|
| 4,625,224 | 11/1986 | Nakagawa et al. . |
| 4,649,624 | 3/1987 | Reedy .......................................... 437/3 |
| 4,693,759 | 9/1987 | Noguchi et al. . |
| 5,145,808 | 9/1992 | Sameshima et al. ..................... 437/173 |
| 5,200,630 | 4/1993 | Nakamura et al. ...................... 257/570 |
| 5,200,846 | 4/1993 | Hiroki et al. .............................. 359/57 |

FOREIGN PATENT DOCUMENTS 2 573 916  5/1986  France .

OTHER PUBLICATIONS

Roth, et al, "Effects of Impurities of the Kinetics of Nucleation and Growth in Amorphous Silicon" (1986) pp. 319–325, *Materials Research Society*.

Kumomi, et al, "Manipulation of Nucleation Sites in Solid-state Si Crystallization" (1991) pp. 3565–3567, *Applied Physics Letters*, 59, No. 27.

Patent Abstracts of Japan, vol. 007, No. 045 (E–160), Feb. 1983 of JP–A–57 194 517 (Tokyo Shibaura Denki KK) Nov. 1982.

Patent Abstracts of Japan, vol. 013, No. 123 (E–733) Mar. 1989 of JP–A–63 292 618 (NEC Corp) Nov. 1988.

Kobayashi, et al, "Recrystallization of Polycrystalline Silicon Islands on Fused Silica" (1983) pp. 35–38, *Japanese Journal of Applied Physics, Supplements*.

Patent Abstracts of Japan, 014, No. 396 (E–0970) (1990) of JP–A–02 148 831 (Hitachi Ltd) Jun. 1990.

Teruo Katoh, "Characteristics of MOSFET's on Large Grain Polysilicon Films" (1988), pp. 923–928, *IEEE Transactions on Electron Devices*, 35, No. 7.

*Primary Examiner*—Stephen D. Meier
*Attorney, Agent, or Firm*—Frishauf, Holtz, Goodman, Langer & Chick, P.C.

[57] ABSTRACT

In the crystal structure of a polysilicon thin film having a field effect mobility $\mu_{FE}$ of about 80 cm²/V.sec, a grain size is about 200 nm and a crystallite size on the (111) plane is about 180 nm. The crystal size corresponds to the size of a completely monocrystallized portion of a grain. The condition of obtaining a field effect mobility $\mu_{FE}$ of about 80 cm²/V.sec is that the crystallite size on the (111) plane is at least 180 nm (measured value). By taking the crystallite size into consideration, it becomes possible to achieve a high field effect mobility $\mu_{FE}$ which cannot be obtained merely by increasing the grain size.

14 Claims, 7 Drawing Sheets

EXCIMER LASER BEAMS

IMPURITY IONS

EXCIMER LASER BEAMS

SEMICONDUCTOR DEVICE HAVING POLYSILICON THIN-FILM

CROSS-REFERENCES TO THE RELATED APPLICATIONS

This application is a Continuation Application of application Ser. No. 08/247,240, filed May 23, 1994 now abandoned, which is a continuation-in-part of U.S. patent application Ser. No. 08/021,333 filed on Feb. 23, 1993 pending.

BACKGROUND OF THE INVENTION

1. Field of the Invention

The present invention relates to a semiconductor device, such as a thin-film transistor, having in its main part a polysilicon thin film for transferring carriers.

2. Description of the Related Art

A technique of forming a thin-film transistor on an insulating substrate is known in the field of active matrix liquid crystal displays (LCDs). The technique allows a semiconductor integrated circuit to be formed on a transparent insulating substrate formed of, for example, glass, or a large insulating substrate which cannot be formed of a monocrystalline semiconductor. At present, a thin-film transistor generally includes an active layer made of amorphous silicon or polysilicon. Since amorphous silicon can be formed at a low temperature, it is applicable to an active matrix LCD which must be formed on a glass substrate having a low melting point.

However, since amorphous silicon has a low electron mobility, it has been used only as a switching element for charging a pixel capacitor electrode to apply an electric field to a liquid crystal. An active layer made of polysilicon must be used in a circuit element, e.g., a driver circuit, a ROM, a RAM or a CPU, which must be driven at a high speed. For example, a driver circuit of a high-quality, large-screen liquid crystal TV or a high-definition office automation (OA) liquid crystal display panel is driven at a clock frequency of about 10 MHz. If such a driver circuit is formed of a semiconductor device, a field effect mobility $\mu_{FE}$ of 50 cm$^2$/V.sec or more, preferably 80 cm$^2$/V.sec or more is required. However, the field effect mobility $\mu_{FE}$ of a polysilicon thin-film transistor known to the public at present is at most 30 cm$^2$/V.sec.

SUMMARY OF THE INVENTION

It is accordingly an object of the present invention to provide a semiconductor device which allows the mobility of carriers to greatly increase. To achieve the object, the semiconductor device of the present invention has a polysilicon thin film in its main part, wherein a grain size is substantially the same as a crystallite size on the (111) plane and the crystallite size is greater than a thickness of the polysilicon thin film (EPC: 180 nm or greater).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

[Basic Concept of the Invention]

It has been considered that the field effect mobility $\mu_{FE}$ of a polysilicon thin-film transistor is determined by grain sizes of silicon crystals constituting an active layer, i.e. a polysilicon thin film. Although there is another determinant such as a trap of carriers which may be caused depending on the state of an interface between the polysilicon thin film and a gate insulating film, it has been considered important to form large and uniform grains, as far as the crystal structure is concerned. Under these circumstances, techniques for an enhancement of the electron mobility by increasing the size and the uniformness of grains have been studied. However, the present inventor discovered throughout his research that it is difficult to enhance the electron mobility only by increasing the grain size of a polysilicon thin film. According to the inventor's research, the electron mobility was not increased beyond a predetermined value however the grain size is increased, whereas it was satisfactorily increased even when the grain size was not very large.

As a result of the research, the inventor found that the crystallite size, as well as the grain size, must be increased to enhance the field effect mobility $\mu_{FE}$ of a thin-film transistor having a polysilicon thin film as an active layer. It is desirable that the grain size and the crystallite size are substantially the same. In addition, the mobility was further increased when the grain size and the crystallite size were greater than the thickness of the polysilicon thin film. This appears to result from the monocrystallization effect due to the state that crystallites having a size regarded as a substantially perfect monocrystal region occupy the main region of the grain and decrease the crystal defects in the grain.

An embodiment of the present invention will be described in detail.

[Embodiment]

FIGS. 1 to 6 show the steps of manufacturing a thin-film transistor according to an embodiment of the present invention. The structure of the thin-film transistor and a method of manufacturing the same will now be described with reference to these drawings in sequence.

Figure 1:
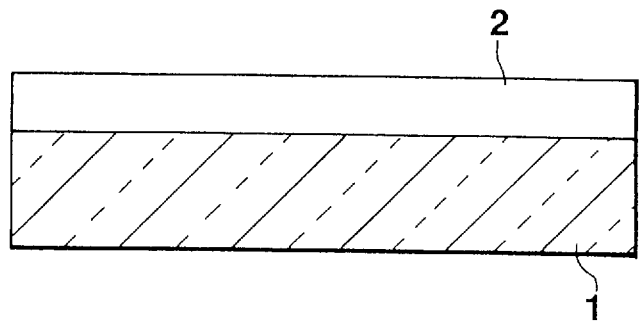
FIGS. 1 to 6 are enlarged cross-sectional views showing the steps of manufacturing a field effect thin-film transistor as an embodiment of a semiconductor device according to the present invention.
Figure 2:
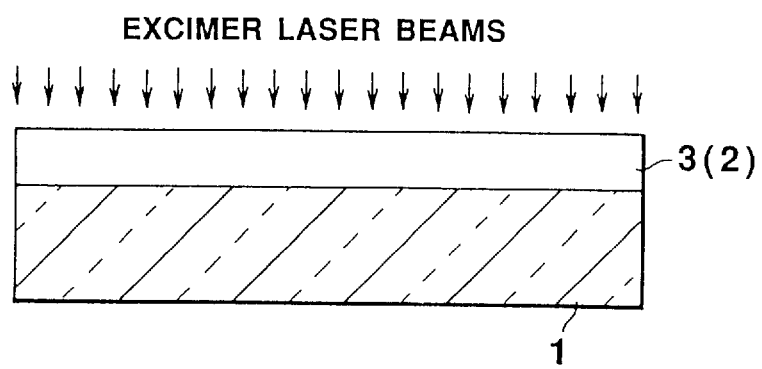
Figure 3:
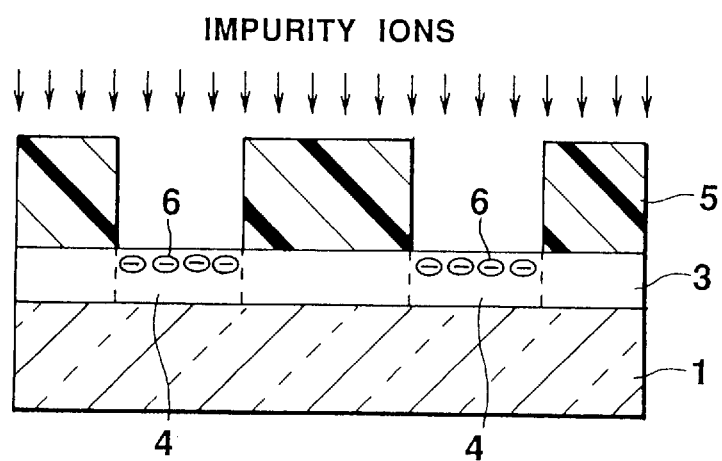
Figure 4:
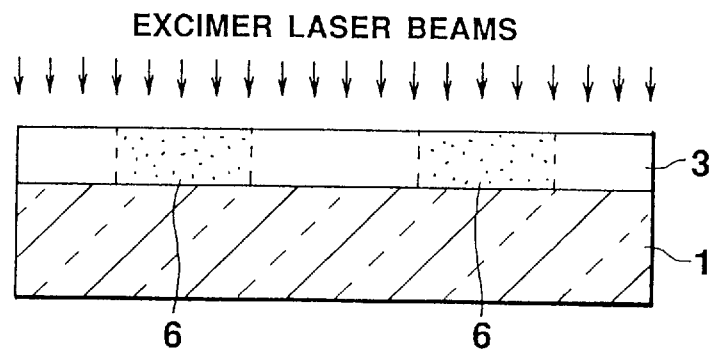
Figure 5:
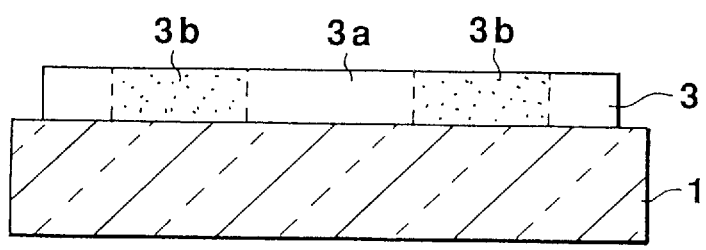
Figure 6:
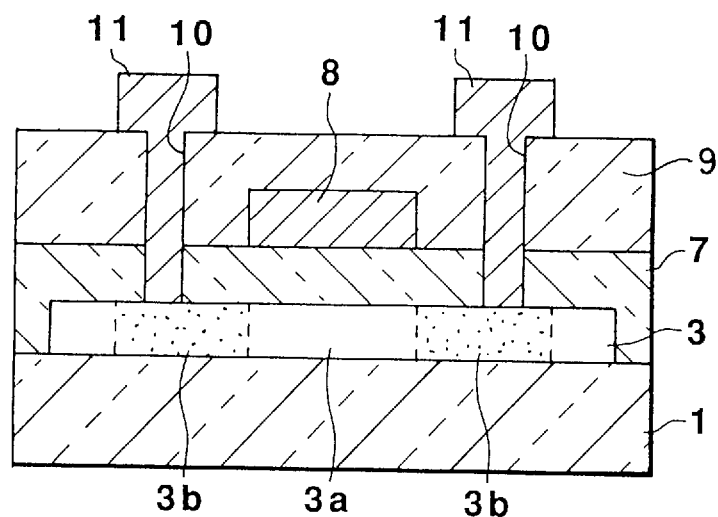

First, as shown in FIG. 1, an amorphous silicon thin film 2 is deposited on the upper surface of an insulating substrate 1 made of quartz or the like by an LP-CVD (Low Pressure Chemical vapor Deposition) method at a temperature of 550° C. Thereafter, as shown in FIG. 2, XeCl excimer laser beams are applied to the substrate, thereby polycrystallizing the amorphous silicon thin film 2 into a polysilicon thin film 3 by a liquid-phase growth. The crystal structure of the polysilicon thin film 3 in this state will be described later. Then, as shown in FIG. 3, a photoresist film 5 is formed on the upper surface of the polysilicon thin film 3, and patterned not to leave on the regions of film 3 which correspond to source and drain forming regions 4. Using the photoresist film 5 as a mask, impurities such as phosphorus ions or boron ions are injected to a high concentration into the source and drain forming regions 4 of the polysilicon thin film 3, thereby forming impurity-injected regions 6. Thereafter, the photoresist film 5 is removed. Next, as shown in FIG. 4, XeCl excimer laser beams are applied to the polysilicon thin film 3 again to activate the impurities injected in the regions 6. Then, as shown in FIG. 5, an unneeded peripheral portion of the polysilicon thin film 3 is removed. A central portion of the polysilicon thin film 3 serves as a channel region 3a, and side portions thereof a source and drain regions 3b formed of activated impurity regions. Subsequently, as shown in FIG. 6, a gate-insulating film 7 formed of a silicon oxide film and the like is formed on the upper surface of the assembly. Thereafter, a gate electrode 8 made of chrome and the like is formed on the upper surface of a portion of the gate insulating film 7 which corresponds to the channel region 3a, by means of a depositing and a patterning. Thereafter, a passivating insulating film 9 made of silicon nitride or the like is formed on the entire upper surface of the assembly. Then, contact holes 10 are formed in those portions of the passivating insulating film 9 and the gate-insulating film 7 which correspond to the source and drain regions 3b. Subsequently, source and drain electrodes 11 made of aluminum and the like are patterned on the passivating insulating film 9 and connected to the source and drain regions 3b through the contact holes 10 are formed on the passivating insulating film 9 and in the holes 10. Thus, a field effect thin-film transistor of a coplanar type is obtained.

The crystal structure of the polysilicon thin film 3 shown in FIG. 2 will now be described with reference to Table 1.

TABLE 1

Sample: LPCVD
Thickness of silicon film: 500Å

| Polycrystal-lizing method | Mobility ($\mu_{FE}$) | Grain size (C) B | Crystallite size (hkl) |
|---|---|---|---|
| Embodiment of Present Invention | | | |
| Laser anneal XeCl excimer laser 250° C., 300 mJ/cm² [Liquid-phase growth] | 90 cm²/V · sec | 246 nm | (111) 202 nm (220) 144 nm (311) 103 nm |
| Prior Art | | | |
| Heat | 30 cm²/V · sec | 1.2 μm | (111) |

TABLE 1-continued

Sample: LPCVD
Thickness of silicon film: 500Å

| Polycrystal-lizing method | Mobility ($\mu_{FE}$) | Grain size (C) B | Crystallite size (hkl) |
|---|---|---|---|
| treatment 600° C. 48 hours [Solid-phase growth] | | | 37 nm (220) 23 nm (311) 36 nm |

As shown in Table 1, a polysilicon thin film according to an embodiment of the present invention was prepared in the following manner: an amorphous silicon thin film having a thickness of about 500Å was deposited on the upper surface of a quartz substrate, and XeCl excimer laser beams were applied twice to the amorphous silicon thin film at a temperature of about 250° C. under an energy density of about 300 mJ/cm², so that the amorphous silicon thin film was polycrystallized in a liquid-phase growth, to obtain a polysilicon thin film. To compare the present embodiment with a conventional device, a polysilicon thin film according to conventional art was prepared in the following manner: an amorphous silicon thin film having a thickness of about 500Å was deposited on the upper surface of a quartz substrate; the substrate was heated in a nitrogen atmosphere at a temperature of about 600° C. for 48 hours, so that the amorphous silicon thin film was polycrystallized in a solid-phase growth, to obtain a polysilicon thin film.

Figure 7:
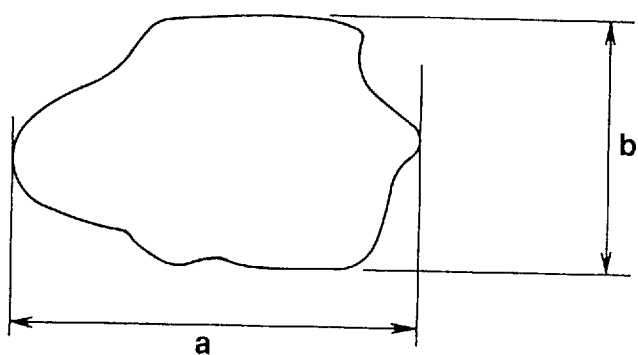
FIG. 7 is a schematic diagram for explaining the definition of a grain size.
Figure 8:
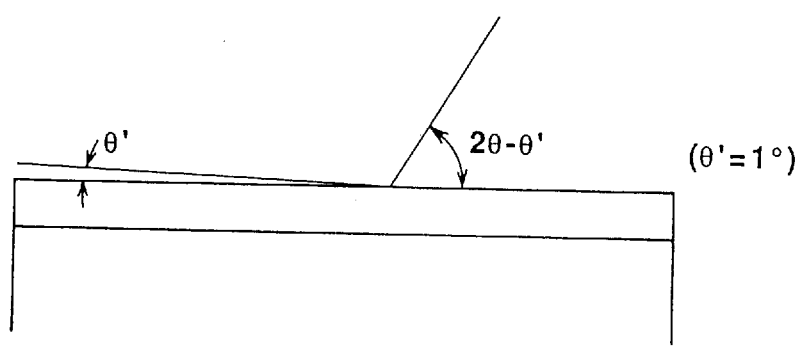
FIG. 8 is a diagram for explaining crystallography by an X ray diffractor.

The crystal structure were analyzed by using a (Transmission Electron Microscope) and an XD (X-ray Diffractor analysis). In case of the TEM, grain size was measured with JEM-2010 of JEOL (acceleration voltage: 200 kV, magnification: 5×10⁵ to 1.5×10⁶). The grain size of the embodiment was 246 nm, whereas the grain size of the prior art was 1.2 μm, which is 5 times greater than the grain size of the embodiment. The grain size refers to the size of a grain in the top view of the polysilicon thin film, and is represented by an average value of the total of average values $c$ of size of grains obtained by the following equation: $c=(a+b)/2$, where $a$ denotes the length of a grain along the major axis and $b$ denotes the length of the grain along the minor axis, for example, as shown in FIG. 7. Each grain size $\overline{C}$ indicated in Table 1 is an average calculated based on the measured values at 30 points.

Figure 11:
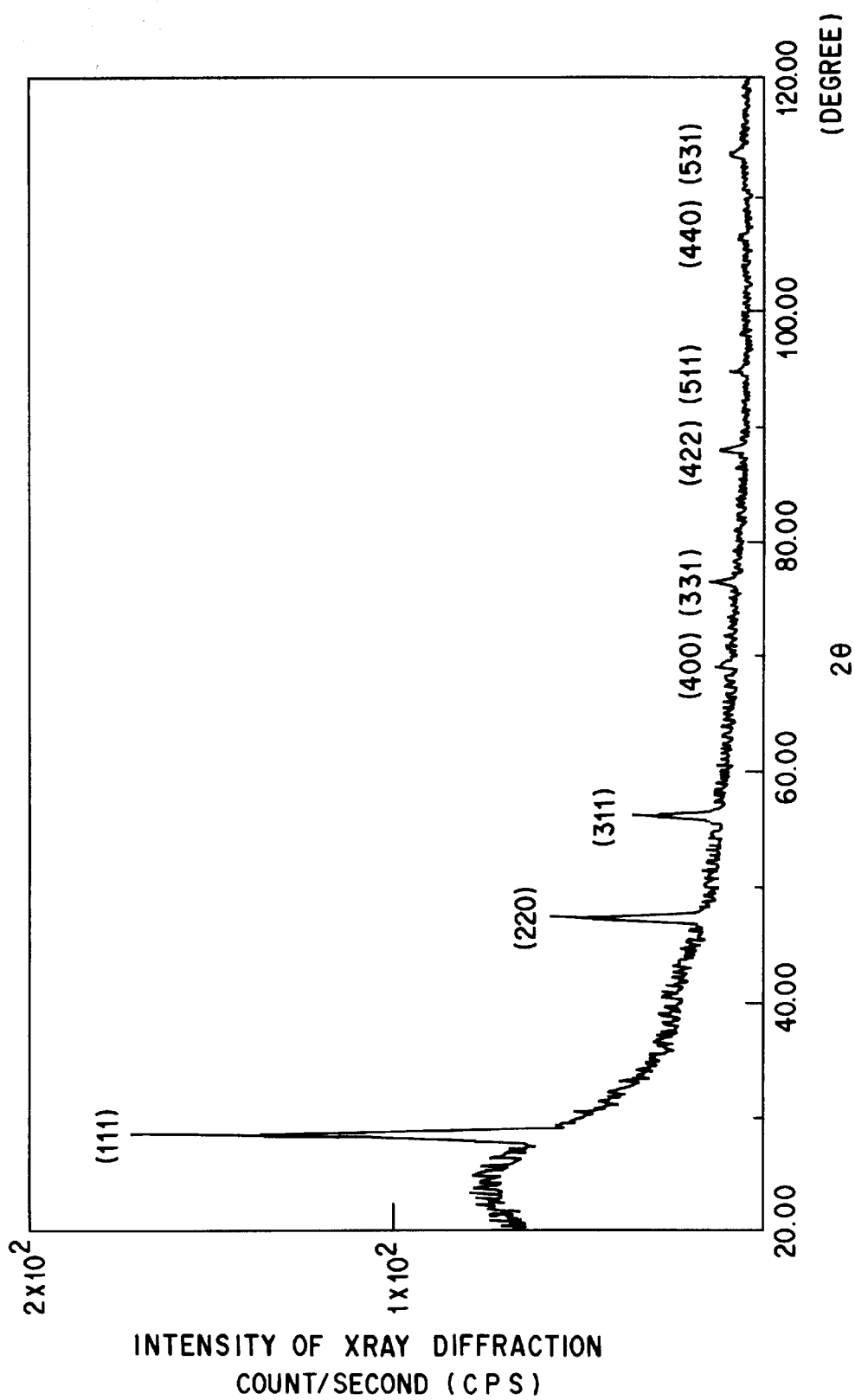
FIG. 11 is a graph showing the surface anisotropy of the intensity of an X-ray diffraction.

The crystallite size by use of the XD was measured by detecting a diffraction intensity by using a low angle incidence method, wherein θ'=1°. The crystallite size was measured with RU-200 of Rigaku Denki Company (radiation source: CuKa, maximum output: 12 kW) under the conditions of the incident X-ray intensity of 50 kV and the power of 180 mW. FIG. 11 is a graph showing the X-ray intensity in a range of 2θ between 20° and 120°. As clearly shown in FIG. 11, the peak intensities on the (111), (220) and (311) planes are greater than those on the other planes. The peak intensities on the (620), (533), (444), (711), (642) and (731) planes in a range of 2θ between 120° and 159° were also measured. However, a definite peak on each of these planes was not detected and the peak intensity on the (111) plane was the greatest.

Figure 12:
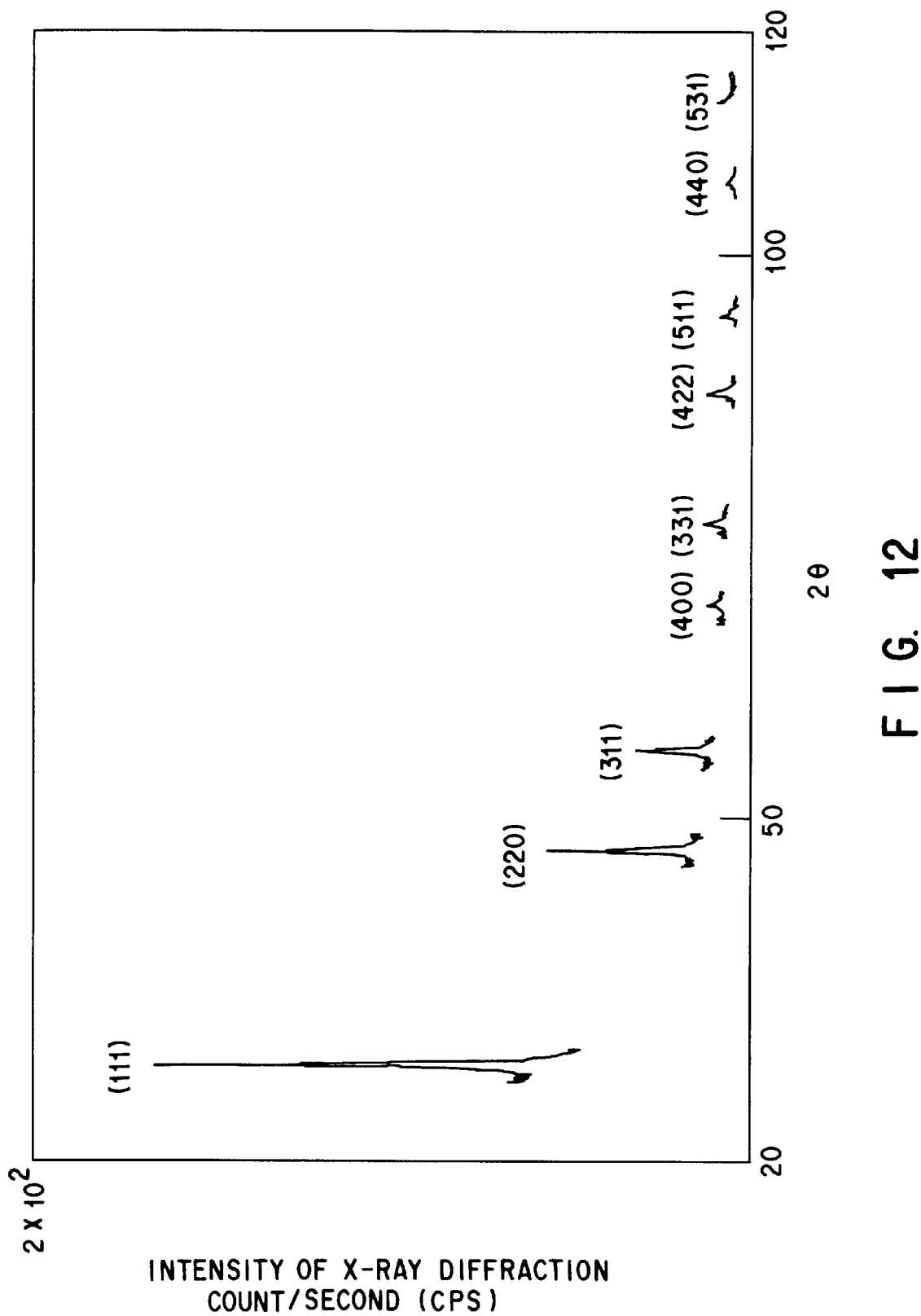
FIG. 12 is a graph showing the peak intensity of an X-ray diffraction and intensities near the peak of a specified plane.

As shown in FIG. 11, the peak intensities on the planes other than the (111), (220) and (311) planes were very weak and greatly influenced by noise. Therefore, the intensity was measured three times by step scanning for 2 seconds with a rotational angle of 0.01° within a range of ±1.5° on each of the peak planes, the result of this measurement is shown in FIG. 12. As clearly shown in FIG. 12, the volume of the (111) plane is the greatest.

The crystallite size was calculated from the peak width at half height by use of the following equation of Scherrer.

$$D_{hkl} = \lambda/(B \cdot \cos\theta B)$$

where $D_{hkl}$ denotes a crystallite size in a direction perpendicular to the (hkl) plane; $\lambda$, a wavelength of an X-ray beam; B, a half width; and $\theta B$, a Bragg's angle. The results of the measurement are shown in Table 1. In the conventional device, the average values of the crystallite size measured in the three-time measurement were 37 nm on the (111) plane, 23 nm on the (220) plane, and 36 nm on the (311) plane, whereas in the present embodiment, the average values were much greater than in the conventional device, i.e., 202 nm on the (111) plane, 144 nm on the (220) plane, and 103 nm on the (311) plane.

Coplanar type field effect thin-film transistors as shown in FIG. 6 were manufactured using the thin films of the embodiment and the conventional art, and the field effect mobilities $\mu_{FE}$ thereof were measured. As shown in Table 1, the mobility in the conventional thin-film transistor was 30 cm²/V.sec, whereas the mobility in the thin-film transistor of the present embodiment was 90 cm²/V.sec, which is three times greater than that of the conventional transistor. The measurement result represents that the field effect mobility $\mu_{FE}$ is correlated to the crystallite size rather than the grain size. This appears to be based on the fact that a thin-film transistor wherein the grain size is large and the crystallite size is small includes a number of crystal defects, while a thin-film transistor wherein the crystallite size is substantially the same as the grain size includes few crystal defects, even if the grain size is small, since the crystallite is regarded as a complete monocrystal region.

Figure 9:
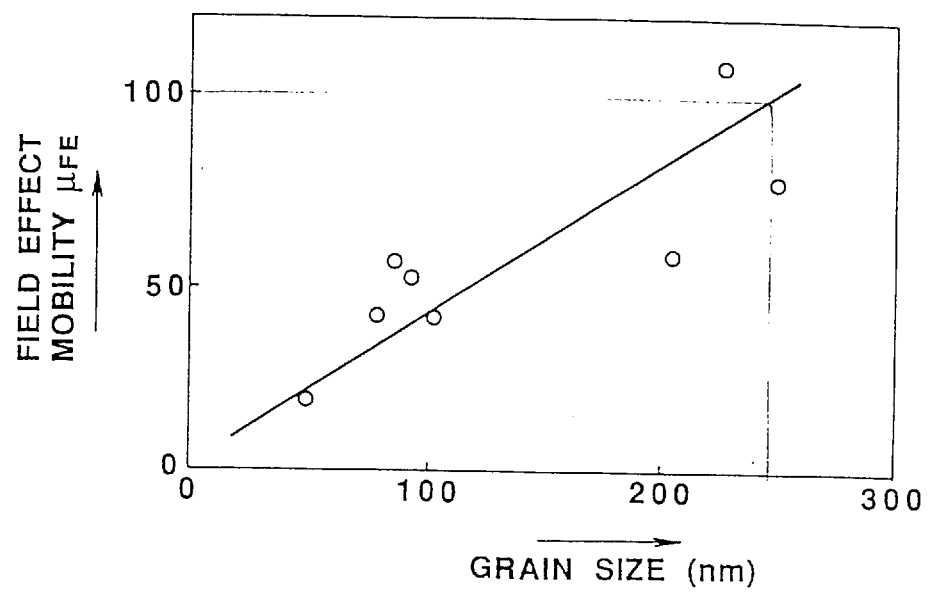
FIG. 9A is a graph showing the grain size-field effect mobility characteristic of the thin-film transistor shown in FIG. 6.
FIG. 9B is a graph showing the crystal size-field effect mobility characteristic of the thin-film transistor shown in FIG. 6.
Figure 9:
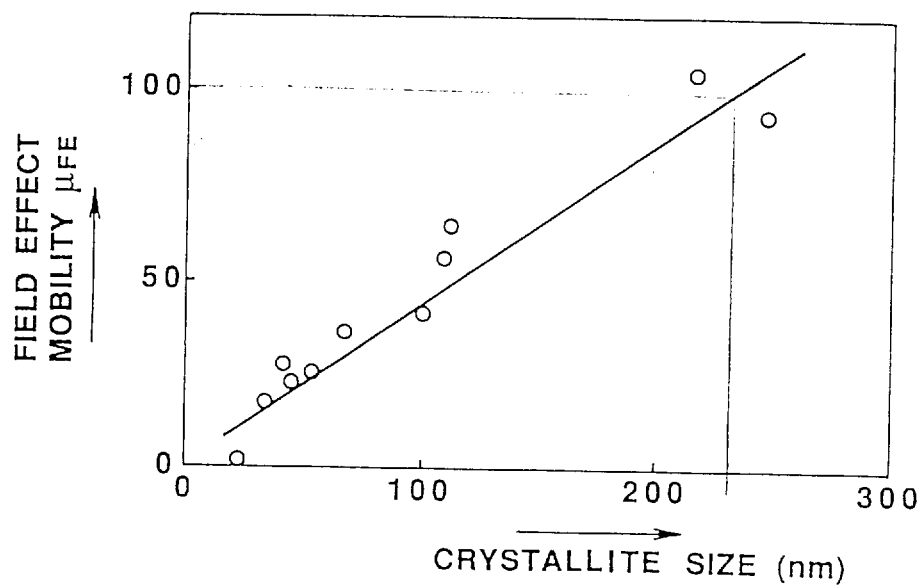
Figure 10:
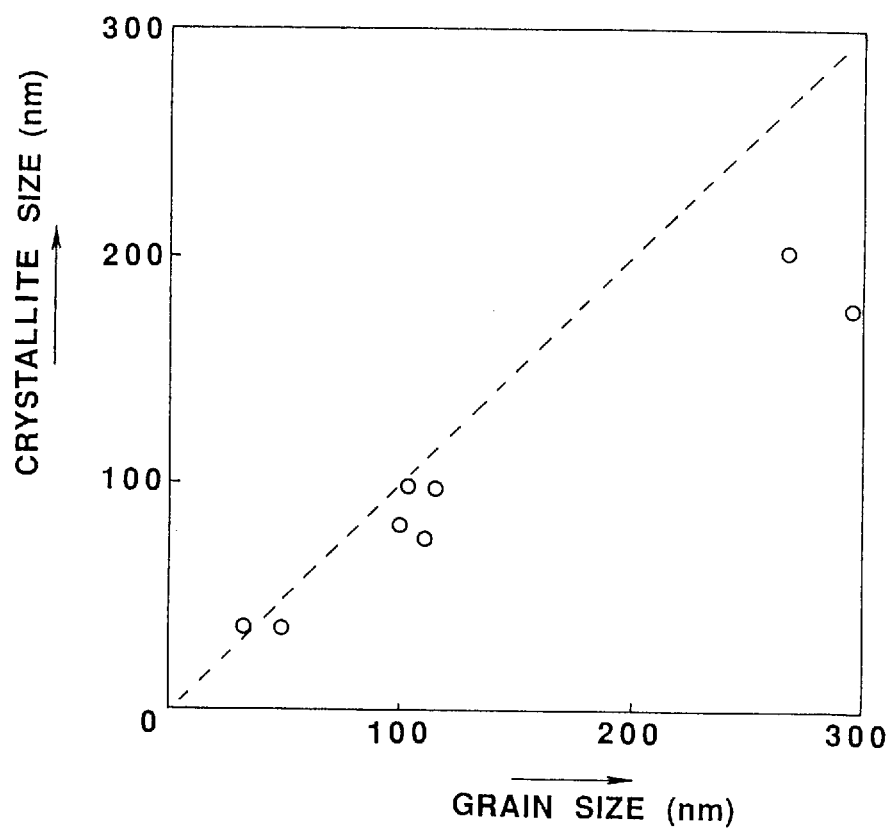
FIG. 10 is a graph showing the grain size-crystallite size characteristic of the thin-film transistor shown in FIG. 6.

To confirm this, a similar measurement was performed with respect to a number of samples according to the embodiment. FIGS. 9A, 9B, and 10 show results of the measurement. Although the sample indicated in Table 1 includes an amorphous silicon film deposited on the substrate to a thickness of 500Å by a LPCVD method, some of the samples indicated in FIGS. 9A, 9B, and 10 are formed by a plasma CVD method or have various thicknesses (500 to 3000Å). FIG. 9A shows the relationship between grain size $\overline{C}$ and field effect mobility $\mu_{FE}$, and FIG. 9B shows the relationship between crystallite size and field effect mobility $\mu_{FE}$ on the (111) plane. FIG. 10 shows the relationship between a grain size and a crystallite size on the (111) plane. Although a crystal size measured by a low-angle incidence method must be corrected, the values of the crystallite size indicated in FIGS. 9B and 10 are calculated by the equation of Scherrer and uncorrected. As shown in FIG. 9A, there is a specific correlation between the grain size C and the field effect mobility $\mu_{FE}$. Further, as shown in FIG. 9B, there is a specific correlation between the crystallite size on the (111) plane and the field effect mobility $\mu_{FE}$. Conditions for the correlations can be understood from FIG. 10. The broken line in FIG. 10, which makes an angle of 45° with the abscissa, represents a characteristic that the ratio of a crystallite size to a grain size is 1:1. As is obvious from FIG. 10, crystallite size approximates the grain size. In the range that the grain size is 100 nm or smaller, it is substantially the same as the crystallite size. In the range that the grain size is greater than 100 nm, the ratio of the crystallite size to the grain size is slightly smaller than 1. In case that the grain size is about 300 nm, the crystallite size is about 60 to 70% of the grain size. If a thin film having the crystallite size the same as the grain size in the range of 200 to 300 nm or greater of the grain size by improving the manufacturing method is obtained, the field effect mobility $\mu_{FE}$ can be further increased.

It is clear from FIGS. 9A and 9B that the crystallite size of about 180 nm (measured value) or greater and the grain size $\overline{C}$ of about 200 nm or greater suffice to obtain a field effect mobility $\mu_{FE}$ of about 80 cm²/V.sec. If these conditions are satisfied, a field effect thin-film transistor having a field effect mobility $\mu_{FE}$ of about 80 cm²/V.sec can be obtained. Accordingly, it is possible to form, using a semiconductor device, a driver circuit which is operated with a clock frequency of about 10 MHz. Conventionally, it has been considered that the field effect mobility $\mu_{FE}$ increases in proportion to the grain size $\overline{C}$. However, the conventional idea, in which the crystallite size is not taken into account, is clearly incorrect in view of Table 1.

Further, referring to Table 1, the crystallite sizes on the (111), (220), and (311) planes of the embodiment are respectively 202 nm, 144 nm, and 103 nm, which are all greater than the thickness of the polysilicon thin film, i.e., 500Å. In contrast, in the conventional device, the crystallite size on the (111) plane, i.e. the maximum peak plane, is 37 nm which is smaller than the thickness of the polysilicon thin film, 500Å. This proves that the field effect mobility $\mu_{FE}$ can be more greatly increased than in the conventional device, if the crystallite size of the polysilicon thin film is greater than the thickness of the polysilicon thin film. According to the embodiment, since the thickness of the polysilicon thin film is 500 to 3000Å, the field effect mobility $\mu_{FE}$ of at least 50 cm²/V.sec is ensured.

The polysilicon thin film can have a thickness of 500 to 1500Å.

The present invention is not limited to a field effect thin-film transistor, but is applicable to any type of semiconductor device having a polysilicon thin film as its main part to transfer carriers.

As has been described above, if a polysilicon thin film has a grain size and a crystallite size which are substantially the same, the field effect mobility $\mu_{FE}$ can be greatly increased, accordingly, a driver circuit which is operated with a clock frequency of about 10 MHz can be formed using a semiconductor device. Note that when the crystallite size is 60 to 70% or greater of the grain size, these sizes are considered to be "substantially the same".

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising a polysilicon thin film having a plurality of silicon grains, each of said silicon grains having a grain size and including a crystallite having a crystallite size on the (111) plane, an average value of the crystallite sizes on the (111) plane of the crystallites included in said polysilicon thin film being sixty percent or greater of an average value of said grain size, said average value of said crystallite sizes on the (111) plane being 180 nm or greater.

2. The semiconductor according to claim 1, wherein said average value of said grain sizes of said silicon grains being greater than 200 nm.

3. The semiconductor device according to claim 1, wherein said polysilicon thin film has a thickness, and said average values of said silicon grain sizes and said crystallite sizes on the (111) plane being greater than said thickness of said polysilicon thin film.

4. The semiconductor device according to claim 3, wherein said thickness of said polysilicon thin film is 500 to 1500Å.

5. The semiconductor device according to claim 1, having a mobility of 80 $cm^2$/V.sec.

6. The semiconductor device according to claim 1, having a mobility of 90 $cm^2$/V.sec.

7. A semiconductor device comprising a polysilicon thin film having a plurality of silicon grains, a gate insulating film directly formed on said polysilicon thin film and a gate electrode directly formed on said gate insulating film; each of said silicon grains having a grain size and including a crystallite having a crystallite size on the (111) plane, an average value of the crystallite sizes on the (111) plane of the crystallites included in said polysilicon thin film being sixty percent or greater of an average value of said grain sizes, said average value of said crystallite sizes on the (111) plane being 180 nm or greater.

8. The semiconductor device according to claim 7, wherein said polysilicon thin film comprises an impurity doped region in which dopants are diffused.

9. The semiconductor device according to claim 8, wherein said polysilicon thin film comprises an intrinsic region which does not include a dopant.

10. The semiconductor device according to claim 7, wherein said average value of said grain sizes of said silicon grains being greater than 200 nm.

11. The semiconductor device according to claim 7, wherein said polysilicon thin film has a thickness, and said average values of said silicon grain sizes and said crystallite sizes on the (111) plane are greater than said thickness of said polysilicon thin film.

12. The semiconductor device according to claim 11, wherein said thickness of said polysilicon thin film is 500 to 1500Å.

13. A semiconductor device comprising a polysilicon thin film having a plurality of silicon grains, a gate insulating film directly formed on said polysilicon thin film and a gate electrode directly formed on said gate insulating film; each of said silicon grains including a grain size and a crystallite having a crystallite size on the (111) plane; an average value of the crystallite sizes on the (111) plane of the crystallites included in said polysilicon thin film being 180 nm or greater, wherein said polysilicon thin film has a thickness, and average values of said silicon grain size and said crystallite sizes on the (111) plane are greater than said thickness of said polysilicon thin film.

14. The semiconductor device according to claim 13, wherein said crystallite on the (111) plane included in each of said silicon grains has substantially the same size as that of each of said silicon grains.

* * * * *